United States Patent
Carrasco Zanini et al.

(10) Patent No.: US 11,283,399 B2
(45) Date of Patent: Mar. 22, 2022

(54) SILICONE RUBBER FOAM BRUSH

(71) Applicant: Saudi Arabian Oil Company, Dhahran (SA)

(72) Inventors: Pablo Carrasco Zanini, Barcelona (ES); Brian Parrott, Thuwal (SA); Ali Shehri, Thuwal (SA)

(73) Assignee: Saudi Arabian Oil Company, Dhahran (SA)

( * ) Notice: Subject to any disclaimer, the term of this patent is extended or adjusted under 35 U.S.C. 154(b) by 0 days.

(21) Appl. No.: 16/889,071

(22) Filed: Jun. 1, 2020

(65) Prior Publication Data

US 2020/0295703 A1 Sep. 17, 2020

Related U.S. Application Data

(60) Continuation of application No. 16/030,107, filed on Jul. 9, 2018, now Pat. No. 10,673,376, which is a division of application No. 15/447,910, filed on Mar. 2, 2017, now Pat. No. 10,020,775.

(60) Provisional application No. 62/303,958, filed on Mar. 4, 2016.

(51) Int. Cl.
*H02S 40/10* (2014.01)
*A46D 1/00* (2006.01)
(Continued)

(52) U.S. Cl.
CPC .............. *H02S 40/10* (2014.12); *A46B 9/005* (2013.01); *A46D 1/0207* (2013.01); *A47L 1/00* (2013.01);
(Continued)

(58) Field of Classification Search
None
See application file for complete search history.

(56) References Cited

U.S. PATENT DOCUMENTS

| | | |
|---|---|---|
| 9,130,502 B1 | 9/2015 | Aly et al. |
| 2013/0086761 A1 | 11/2013 | Singh et al. |

(Continued)

FOREIGN PATENT DOCUMENTS

| | | |
|---|---|---|
| CN | 202178289 U | 3/2012 |
| CN | 104470647 A | 3/2015 |

(Continued)

OTHER PUBLICATIONS

JPO translation of JP 2008-073063 retrieved from https://www.j-platpat.inpit.go.jp/p0200 on Jul. 15, 2021 (Year: 2021).*

(Continued)

*Primary Examiner* — Eric W Golightly
(74) *Attorney, Agent, or Firm* — Leason Ellis LLP

(57) ABSTRACT

A brush suitable for performing at least one of a cleaning, buffing, and polishing action on a surface without requiring water comprises a core member, the core member having a central axis surrounded by a plurality of C-channel grooves and a plurality of sheets of material, each sheet of material comprised of closed-cell silicone foam rubber, being folded to define a double-sided flap, and secured to a respective one of the plurality of C-channel grooves. The sheet of material is secured to the core member to permit relative movement of the double-sided flap with respect to the surface in at least a first direction, and the relative movement of the double-sided flap produces at least one of the cleaning, buffing and/or polishing action on the surface without requiring water.

6 Claims, 12 Drawing Sheets

(51) Int. Cl.
    *A47L 1/00*     (2006.01)
    *B08B 1/00*     (2006.01)
    *B08B 1/04*     (2006.01)
    *B08B 11/04*     (2006.01)
    *A46B 9/00*     (2006.01)
    *F24S 40/20*     (2018.01)

(52) U.S. Cl.
    CPC .............. *B08B 1/001* (2013.01); *B08B 1/002* (2013.01); *B08B 1/006* (2013.01); *B08B 1/008* (2013.01); *B08B 1/04* (2013.01); *B08B 11/04* (2013.01); *F24S 40/20* (2018.05); *Y02E 10/40* (2013.01)

(56) References Cited

U.S. PATENT DOCUMENTS

| | | |
|---|---|---|
| 2013/0305474 A1 | 11/2013 | Meller et al. |
| 2014/0157536 A1 | 6/2014 | Blouin |
| 2014/0202492 A1 | 7/2014 | Grossman et al. |

FOREIGN PATENT DOCUMENTS

| | | |
|---|---|---|
| EP | 1600096 A2 | 11/2005 |
| EP | 2740387 A1 | 6/2014 |
| IT | 3020130212 A1 | 11/2014 |
| JP | 2006036176 A | 9/2006 |
| JP | 2008073063 A * | 4/2008 |

OTHER PUBLICATIONS

Singapore Search Report and Written Opinion in Corresponding Application No. 11201806795P dated Jul. 14, 2020. 8 pages.

Japanese Office Action in Corresponding Japanese Application No. 2018-545433 dated Oct. 26, 2020. 9 pages.

International Search Report and Written Opinion in Corresponding PCT Application No. PCT/US17/20412 dated Oct. 23, 2017. 21 pages, submitted for U.S. Appl. No. 15/447,910 IDS filed Jan. 23, 20148.

Japanese Office Action in Corresponding Japanese Application No. 2018-545433 dated Mar. 1, 2021 6 pages.

Chinese Office Action in Corresponding Chinese Application No. 201780015116.4 dated Apr. 1, 2021. 26 pages.

Office Action in corresponding EP Application No. 17713801.3, dated Nov. 4, 2021 7 pages.

\* cited by examiner

SILICONE RUBBER FOAM BRUSH

CROSS REFERENCE TO RELATED APPLICATIONS

The present application is a continuation application of U.S. patent application Ser. No. 16/030,107 filed on Jul. 9, 2018 and issued as U.S. Pat. No. 10,673,376 on Jun. 2, 2020, entitled SILICONE RUBBER FOAM BRUSH, which is a divisional application of U.S. patent application Ser. No. 15/447,910 filed on Mar. 2, 2017 and issued as U.S. Pat. No. 10,020,775 on Jul. 10, 2018, entitled SILICONE RUBBER FOAM BRUSH, which, in turn, claims the benefit of priority under 35 U.S.C. § 119(e) from U.S. Provisional Application Ser. No. 62/303,958, filed on Mar. 4, 2016 having the same title, each of which is hereby incorporated by reference as if expressly set forth in their respective entireties herein.

FIELD OF THE INVENTION

The present invention generally relates to brush elements, and more particularly, to silicone foam rubber brushes.

BACKGROUND OF THE INVENTION

Cleaning brushes of various designs have been used for a variety of industrial, commercial and consumer applications. Typical synthetic foam materials have been used in certain cleaning applications, for example, cleaning cars. These synthetic foam materials provide a benefit over non-woven materials in that they don't absorb water. In addition, these synthetic foam materials also resist dirt and debris accumulating and remaining in the material. Dirt and debris that is maintained in the cleaning material can scratch the cleaning surface when the dirt impregnated material is brought into contact with the cleaning surface during subsequent cleaning operations. Despite the benefits provided by typical synthetic foam materials, improved cleaning performance is desirable.

The present invention addresses these and other limitations associated with cleaning brushes.

SUMMARY OF THE INVENTION

According to an aspect of the invention, a method of performing at least one of a cleaning, buffing, and polishing action on a surface of a solar panel is provided. The method includes the steps of providing a core member and providing at least one sheet of material. The at least one sheet of material is comprised of closed-cell silicone foam rubber and has a first free end portion. The at least one sheet of material is attached to the core member with the first free end portion extending away from the core member. The method includes the step of causing the core member to move in a first direction such that a portion of the at least one sheet of material is brought into contact with the surface of the solar panel in a repeating pattern. The method further includes the step of causing the core member to move in a second direction such that the core member moves along an area of the solar panel so as to perform the at least one of a cleaning, buffing, and polishing.

In accordance with a further aspect, the method further includes the step of providing a flexible structural element disposed adjacent a trailing side of the at least one sheet of material, wherein the flexible structural element is configured to increase a pressure between the at least one sheet of material and the surface during the contact.

In accordance with yet further aspect, the first direction is a rotational direction and wherein the second direction is a translational direction.

In accordance with a further aspect, a light transmission characteristic of the solar panel is improved.

In accordance with still further aspect, the at least one sheet of material includes a second free end portion and a middle section disposed between the first and second free end portions, and wherein at least a portion of the middle section is attached to the core member and the first and second free end portions extend away from the core member.

In accordance with a further aspect, the core member includes a flat surface adjacent the attachment of each said sheet of material.

In accordance with another aspect, a method of performing at least one of a cleaning, buffing, and polishing action on a surface, without requiring water, is provided. The method comprises the steps of providing a core member and providing at least one sheet of material. The at least one sheet of material is comprised of closed-cell silicone foam rubber and has a first free end portion. The at least one sheet of material is attached to the core member with the first free end portion extending away from the core member. The method includes the step of causing the core member to move in a first direction such that a portion of the at least one sheet of material is brought into sliding contact with the surface in a repeating pattern. The sliding contact between the at least one sheet of material and the surface occurs under a pressure and relative velocity sufficient to generate a force that results in at least one of a cleaning, buffing, and polishing.

In accordance with a further aspect, the first direction is a rotational direction.

In accordance with a still further aspect, the second direction is a translational direction.

In accordance with a yet further aspect, the method includes the step of providing a flexible structural element disposed adjacent a trailing side of the at least one sheet of material wherein the flexible structural element is configured to increase the pressure between the at least one sheet of material and the surface during the sliding contact.

In accordance with a further aspect, the surface is a solar panel and a light transmission characteristic of the solar panel is improved.

In accordance with a still further aspect, the at least one sheet of material includes a second free end portion and a middle section disposed between the first and second free end portions, and wherein at least a portion of the middle section is attached to the core member and the first and second free end portions extend away from the core member.

In accordance with another further aspect, the wherein the core member includes a flat surface adjacent the attachment of each said sheet of material.

In accordance with another aspect, a brush configured to perform at least one of a cleaning, buffing, and polishing action on a surface is provided. The brush includes a core member having a central axis and a periphery. The brush includes at least one sheet of material comprised of closed-cell silicone foam rubber and has at least a first free end portion. The at least one sheet of material is attached to the core member with the at least first free end portion extending away from the periphery of the core member such that the material attachment is substantially parallel to the central axis of the core member. The core member includes a flat surface adjacent the attachment of each said sheet of material. The core member and the at least one sheet of material are configured for relative movement with respect to the surface in at least a first direction. The motion in the first direction causes the at least first free end portion of the at least one sheet of material to contact the surface at a non-zero velocity and the motion of the at least first free end portion of the at least one sheet of material produces at least one of the cleaning, buffing and/or polishing action on the surface.

In accordance with a further aspect, the core member defines a substantially cylindrical member having curved portions adjacent each flat surface.

In accordance with a still further aspect, the core member has a rigidity in excess of the rigidity of the at least one sheet of material.

In accordance with another further aspect, the core member is configured for relative movement in the first direction such that the core member is configured to move and the surface is substantially stationary.

In accordance with a yet further aspect, the core member is configured for relative movement in the first direction such that the core member is configured to remain substantially stationary relative to a moving surface.

In accordance with a further aspect, the first direction of movement of the core member is translational movement.

In accordance with another further aspect, the first direction of movement of the core member is rotational movement.

In accordance with a still further aspect, the core member, and the at least one sheet of material, are configured for movement in at least a second direction.

In accordance with a yet further aspect, the second direction of movement is rotational about the central axis of the core member.

In accordance with a further aspect, the at least one sheet of material includes a second free end portion and a middle section disposed between the first and second free end portions, and wherein at least a portion of the middle section is attached to the core member and the first and second free end portions extend away from the periphery of the core member.

In accordance with a still further aspect, the middle section of the at least one sheet of material includes first and second portions, and the first portion of the middle section is attached to the core member at a first location and the second portion of the middle section is attached to the core member at a second location.

In accordance with a yet further aspect, a third portion of the middle section of the at least one sheet of material is disposed between the first and second portions, and wherein the third portion extends about a periphery of the core member between the first and second locations.

In accordance with a further aspect, the core member includes at least one c-channel groove and the at least one sheet of material is attached to the core member via the c-channel groove.

In accordance with a still further aspect, the at least one sheet of material includes a second free end portion and a middle section disposed between the first and second free end portions, and wherein at least a portion of the middle section is retained in the c-channel groove.

In accordance with a yet further aspect, the brush includes at least one securement rod, wherein the rod is disposed within the c-channel groove to retain the middle section of the sheet of material within the c-channel groove.

In accordance with a yet further aspect, the brush includes at least one securement coil, wherein the coil is disposed within the c-channel groove to retain the middle section of the sheet of material within the c-channel groove.

In accordance with another aspect, a method of pretreating a surface of a solar panel is provided. The method includes the steps of providing a brush having closed-cell silicone foam rubber flaps and brushing the surface using the brush until an increase of performance of the solar panel is achieved.

In accordance with a further aspect, the solar panel is exposed to approximately 7,000 brushing cycles.

In accordance with another aspect, a method of performing at least one of a cleaning, buffing, and polishing action on a surface of a solar panel is provided. The method includes the steps of providing first and second supports and providing a belt. The belt is comprised of closed-cell silicone foam rubber and the belt extends about the first and second supports. The method includes the step of causing the supports to rotate such that a portion of the belt is brought into sliding contact with the solar panel in a repeating pattern. The sliding contact between the belt and the solar panel occurs under a pressure and relative velocity sufficient to generate a force that results in at least one of a cleaning, buffing, and polishing.

In accordance with a further aspect, a light transmission characteristic of the solar panel is improved.

In accordance with another aspect, a method of performing at least one of a cleaning, buffing, and polishing action on a surface of a solar panel is provided. The method includes the steps of providing a backer plate and providing a pad. The pad is comprised of closed-cell silicone foam rubber and is attached to the backer plate. The method includes the step of causing the backer plate to move such that a portion of the pad is brought into sliding contact with the solar panel in a repeating pattern. The sliding contact between the pad and the solar panel occurs under a pressure and relative velocity sufficient to generate a force that results in at least one of a cleaning, buffing, and polishing.

In accordance with a further aspect, a light transmission characteristic of the solar panel is improved.

In accordance with another aspect, a surface treatment tool configured to perform at least one of a cleaning, buffing, and polishing action on a solar panel surface is provided. The tool includes first and second supports and a belt. The belt is comprised of closed-cell silicone foam rubber and the belt extends about the first and second supports. The supports are configured to rotate such that a portion of the belt is brought into sliding contact with the solar panel in a repeating pattern. The sliding contact between the belt and the solar panel occurs under a pressure and relative velocity sufficient to generate a force that results in at least one of a cleaning, buffing, and polishing.

In accordance with a further aspect, the first and second supports each define substantially cylindrical members.

In accordance with a still further aspect, the first and second supports each has a rigidity in excess of the rigidity of the belt.

In accordance with another aspect, a surface treatment tool configured to perform at least one of a cleaning, buffing, and polishing action on a solar panel surface is provided. The tool includes a backer plate and a pad. The pad is comprised of closed-cell silicone foam rubber and the pad is attached to the backer plate. The backer plate is configured to move such that a portion of the pad is brought into sliding contact with the solar panel in a repeating pattern. The sliding contact between the pad and the solar panel occurs under a pressure and relative velocity sufficient to generate a force that results in at least one of a cleaning, buffing, and polishing.

In accordance with a further aspect, the backer plate is configured to move in at least one a side-to-side motion, front-to-back motion, twisting motion, and orbital motion and combinations thereof.

In accordance with a still further aspect, wherein the backer plate has a rigidity in excess of the rigidity of the pad.

DETAILED DESCRIPTION CERTAIN OF EMBODIMENTS OF THE INVENTION

Figure 1A:
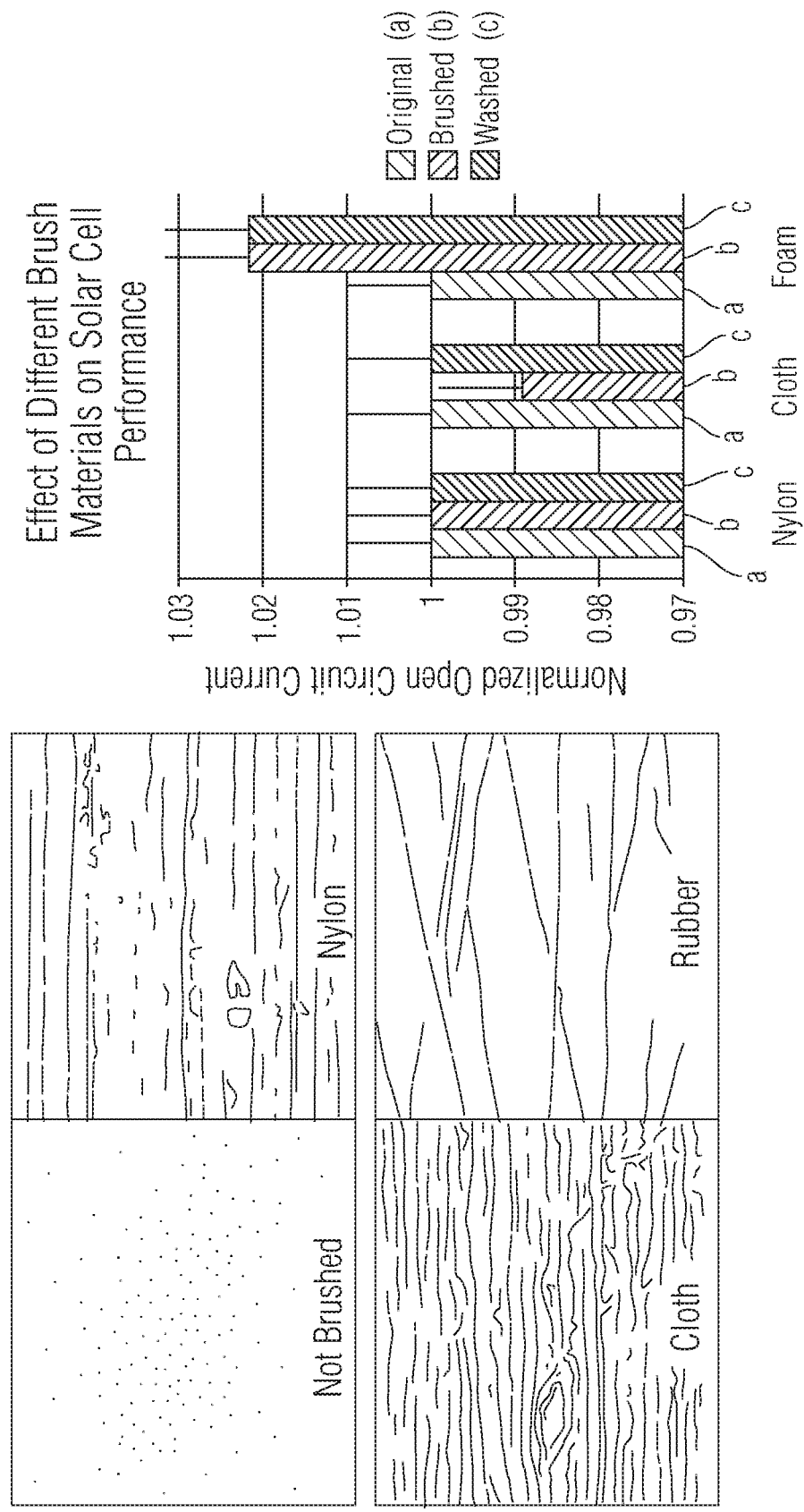
FIG. 1A shows the effects on a solar panel after brushing with a brush according to an embodiment of the present invention.

By way of overview and introduction, the invention is described in connection with one or more embodiments in which a silicone foam material is provided to perform one of a cleaning, buffing, and polishing of a surface. The silicone foam material can be supported by a core member that can be a C-channel extrusion to provide a rotatable brush. The silicone foam brush can be used in various cleaning applications, but it has been found to provide significant benefits during dry cleaning of solar panels, as discussed in more detail below. The silicone foam material is a closed-cell silicone foam. The silicone foam can be provided in the form of sheets. The thickness and dimensions of the foam sheets are selected based upon design requirements of the cleaning objectives. For example, thicker sheet material can be provided where increased brush force is required.

The use of a closed-cell silicone foam rubber material provides significant improvements over standard brush designs and materials. It was found that use of closed-cell silicone foam as a brush material provides a lubricating effect during cleaning operations. Reducing friction between the brush and the cleaning surface is important to reduce wear on the brush materials as well as wear on the cleaning surface. Again, it is particularly important to prevent wear on the cleaning surface when the surface being cleaned is a solar panel since damage to the glass surface/anti-reflective coating of solar panels can significantly impact performance of the solar panels over time. In the particular application of dry cleaning solar panel surfaces, it has been observed that the silicone material itself appears to provide a lubricating effect between the brush and the cleaning surface. This lubricating effect reduces wear and damage to both the brush material and the cleaning surface.

Typically, water and/or soap are used during the cleaning of solar panel surfaces. However, due to the lubricating effect of the closed-cell silicone rubber, the solar panels can be cleaned dry, without the use of soap and/or water. Using closed-cell silicone foam rubber, which provides a lubricating effect, significantly reduces the time, cost, and environmental impact of cleaning solar panels versus using soap and water. The infrastructure associated with providing the water to the solar panels (which may be located in remote, arid regions), the application of the water and soap to the panels, and the cost and effort of environmentally disposing of the waste water and soap can be avoided. Accordingly, using the silicone foam rubber without requiring water, and also without requiring soap can provide significant advantages in terms of performance, cost, efficiency, and environmental impact.

In addition to its lubricating effect, closed-cell silicone foam rubber also resists the retention of moisture, dust, and debris into the structure of the brush material. Accordingly, the brushes resist becoming water logged if moisture is present, which can affect the performance of the bush due to increased and/or unbalanced weight. Resistance to dust and debris retention reduces the chance that dust and debris will damage the cleaning surface. The closed-cell silicone rubber also has a higher elasticity as compared to designs using typical synthetic foam. The higher elasticity of the closed-cell silicone foam rubber increases performance of the brush because the closed-cell silicone foam rubber is better able to conform to the cleaning surface as the brush rotates, especially at high rotation speeds. The ability of the brush to conform to the surface increases the contact surface area between the brush and surface which increases cleaning efficiency. Closed-cell silicone foam rubber is also resistant to UV light and has favorable strength and durability characteristics. Accordingly, the closed-cell silicone foam rubber brush of the present invention is particularly suited for high demand applications, such as cleaning of solar panels exposed to harsh outdoor environments. However, the characteristics of the closed-cell silicone foam rubber brush are suitable for a number of cleaning applications, including in traditional, wet-cleaning brush applications.

Closed-cell silicone foam rubber brushes provides another unexpected benefit in the application solar panel cleaning in that the use of closed-cell silicone foam rubber brushes improve the efficiency of the solar panel to collect and convert light to electricity. According to one experiment, solar panels were exposed to 20 years equivalent of daily cleaning of solar panels exposed to sand with various brush material. The performance of the solar panels was tested prior to bushing, after bushing, and then were measured again after a washing with water. The surface of the panels was also imaged with a scanning electron microscope to detect surface wear. The results of the testing are shown in FIG. 1A.

Referring to FIG. 1A, the solar panel surface wear due to the various brushing with nylon, cloth, and closed-cell silicone foam rubber ("rubber") can be seen in the microscope images. The surface brushed with a nylon brush has deep, parallel scratching of the non-reflective coating. The cloth brush wore the anti-reflective coating so significantly that it left holes in places. The silicone rubber foam brush ("rubber") left marks in a cross-hatch pattern, but they were not very deep as compared to the nylon brush and cloth brush.

The panels were also tested using a solar cell testing setup that measures the solar cell's electrical current production under standard light/temperature conditions. Electrical current production is proportional to the amount of light that the cells are receiving (through the glass/coating/dirt). This is a standard method of determining the performance of a cleaning solution, surface coating, or cell composition. The cells were each measured originally, prior to bushing, with the result are shown in the chart of FIG. 1A shown as column "a" (at least 2 independent cells, measured multiple times). The cells were cycled through the wear test and performance was measured again (column "b"). Then the panels were washed with water and measured again (column "c").

For the cells that were cleaned with the nylon brush, the cell's performance remained constant throughout the procedure. Though the anti-reflective coating experienced significant wear, it was not sufficient to change the performance of the cell in standard conditions by a significant amount.

For the cells that were cleaned with the (non-woven) cloth brush, performance dropped after the wear test. However, performance was nearly restored to levels prior to the wear test after washing with water, despite the damage to the anti-reflective coating.

Figure 1B:
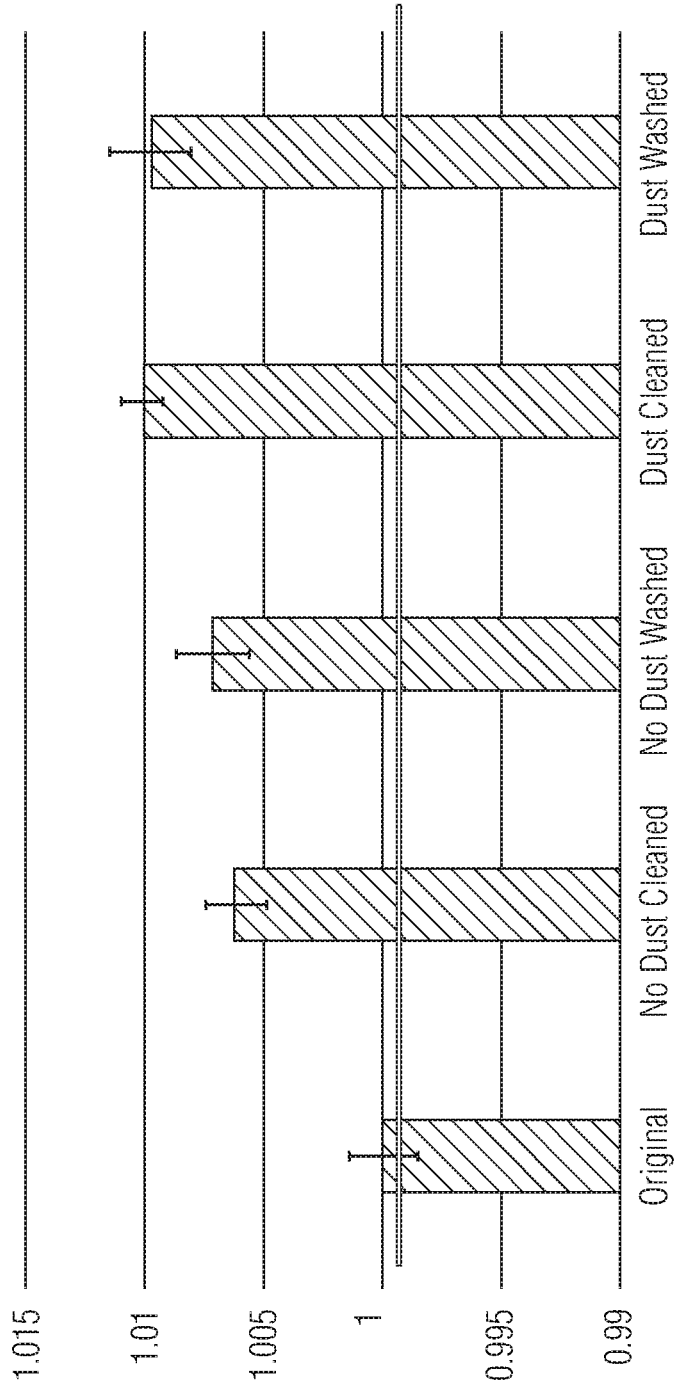
FIG. 1B shows the effects on a solar panel after brushing with a brush according to an embodiment of the present invention.
Figure 1C:
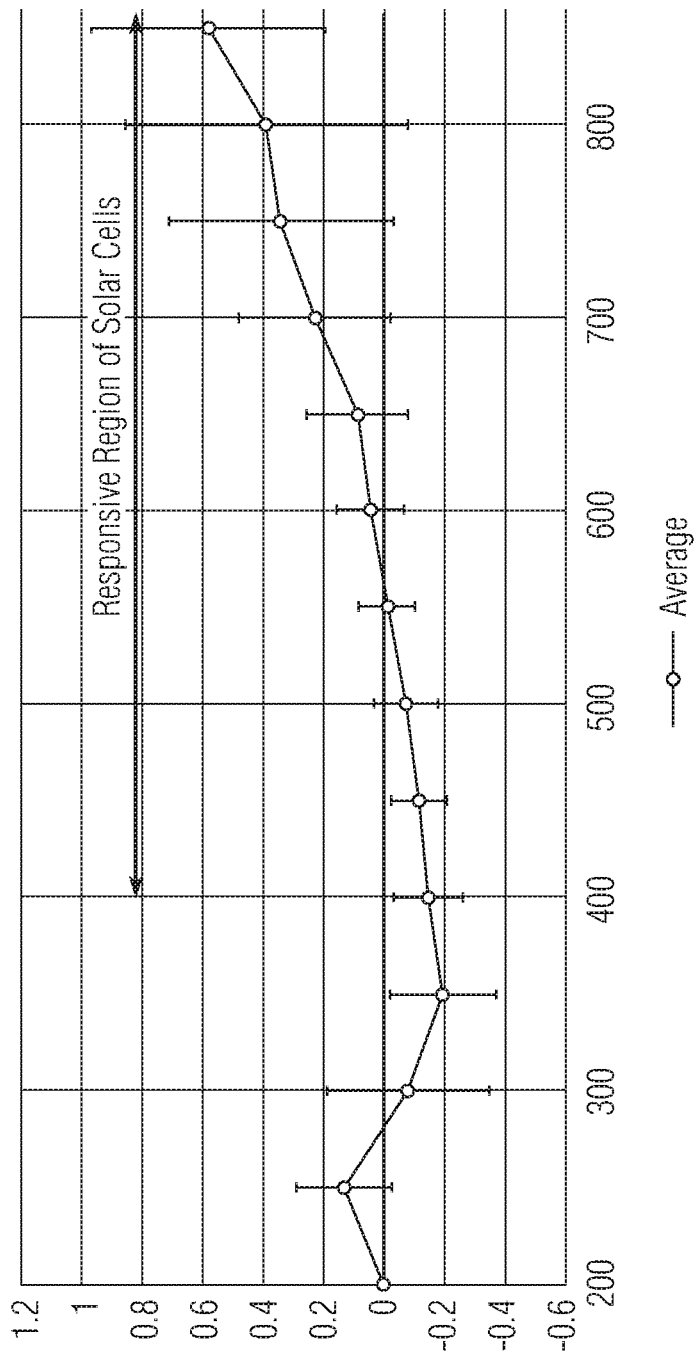
FIG. 1C shows the effects on glass after brushing with a brush according to an embodiment of the present invention.

In the case of the silicone rubber foam brush, a clear rise in efficiency of the cell was observed, as shown by columns b and c of the graph. After brushing and washing, the solar cells brushed with the closed-cell silicone foam rubber brush produced more than 1.02 Normalized Open Circuit Current. Moreover, referring to FIGS. 1B and 1C, data indicates improvements in solar panel performance and glass transmissivity, respectively. Although the reason for this improvement is not conclusively understood, it is believed that it is due to the non-linear roughening of the surface at the microscopic level caused by the brushing with the closed-cell silicone foam rubber. The surface roughening may break up the uniformity of the surface and let more light through. This improvement in the performance of the solar panel indicates that cleaning with the silicone rubber foam brush is not only advantageous for the purpose of cleaning, but solar panel performance may also benefit from pre-deployment treatments by brushing with closed-cell silicone foam rubber. Accordingly, it may be useful to expose a solar panel surface to brushing with a closed-cell silicone rubber foam brush in simulated cleaning cycles until an improvement in efficiency of the solar cell is achieved. As one example, it may be beneficial to expose the solar panel surface to approximately 7,000 cleaning cycles in which the brush removes sand from the surface of the panels.

Figure 2:
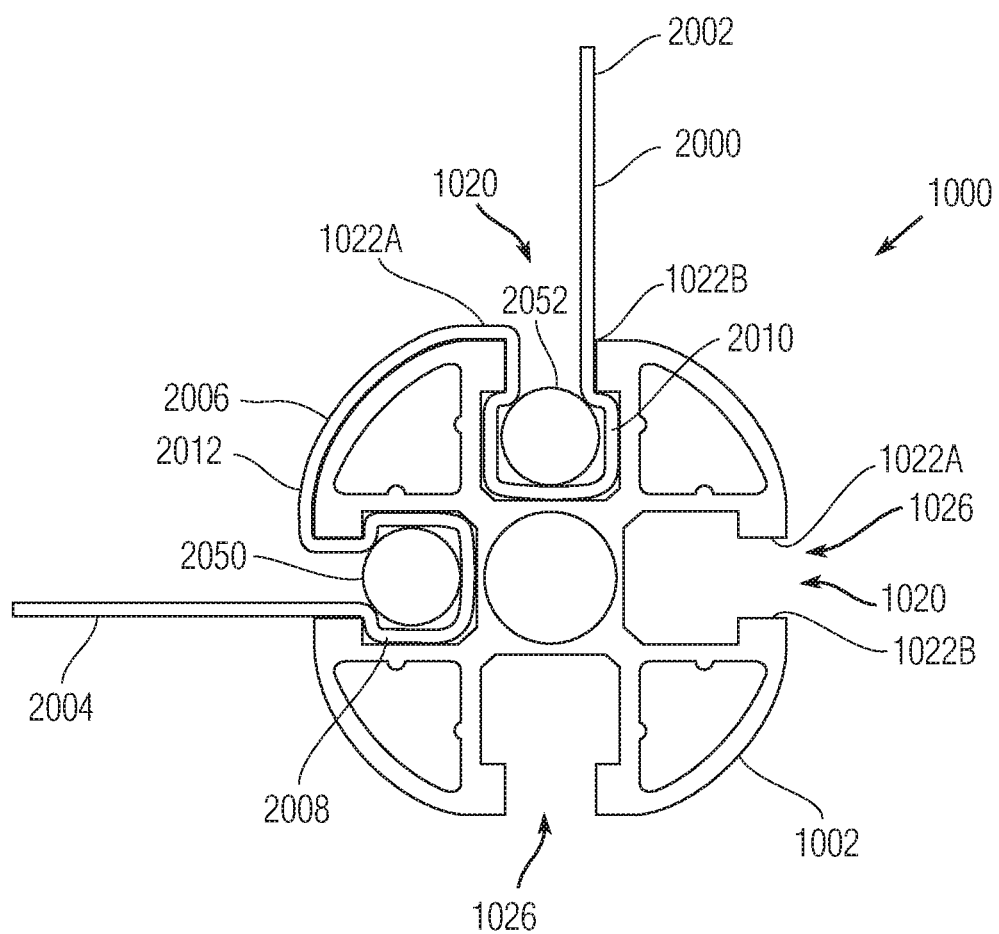
FIG. 2 shows a cross-section view of an elongated structural member with C-channel grooves, having brush flaps according to a first arrangement.

Referring to FIG. 2, a closed-cell silicone foam rubber brush 1000 is shown according to one embodiment. The brush 1000 includes an extrusion 1002 having a cross-section that provides structure for the mechanical attachment of accessories. The extrusion 1002 includes C-channel grooves 1020 around its perimeter. The C-channels further comprise a mouth 1026 and two opposing lips 1022A and 1022B attached to either side of the mouth. A sheet of closed-cell silicone foam rubber material 200 is attached to the extrusion 1002 such that the sheet is secured in two, adjacent C-channel grooves to form two brush flaps 2002 and 2004 that extend from the extrusion. The free ends 2002 and 2004 of the sheet 2000 each define a flap of the brush. The intermediate portion 2006 of the sheet 2000 is secured to the extrusion 1002. A first section 2008 of the intermediate portion 2006 is inserted in a first C-channel 1020. A second section 2010 of the intermediate portion 2006 is inserted in a second C-channel 1020. A third section 2012 of the intermediate portion 2006 extends around a section of the outer periphery of the extrusion 1002 between the two C-channels. Attachment rods 2050 and 2052 are disposed within each of the C-channels and are positioned such that the sheet material is disposed between the extrusion 1000 and the attachment rods 2050 and 2052. The attachment rods 2050 and 2052 secure the foam sheet in place. Accordingly, attaching two foam sheets to the extrusion 1002 in this manner results in a brush having four flaps. As another example, the extrusion can include more or less C-channels in order to provide a core member that has more or less attachment points for the sheets of material. Accordingly, the core member can include a varying number of flaps disposed around its periphery, and more specifically, an outer periphery, and extending therefrom. The flaps can be arranged in pairs such that they are disposed on opposite sides of the core member. In other arrangements, the flaps can be spaced about the outer periphery of the core member at equal spacings in order to provide a balanced distribution about the core member. During cleaning, buffing, or polishing operations, the free ends portions and/or a more proximal section of the flap can contact the surface depending on the velocity, rigidity (bending), and/or spacing of the flaps from the surface. Accordingly, a portion of the flap is brought into sliding contact with the surface to perform a cleaning, buffing, or polishing operation.

Figure 3A:
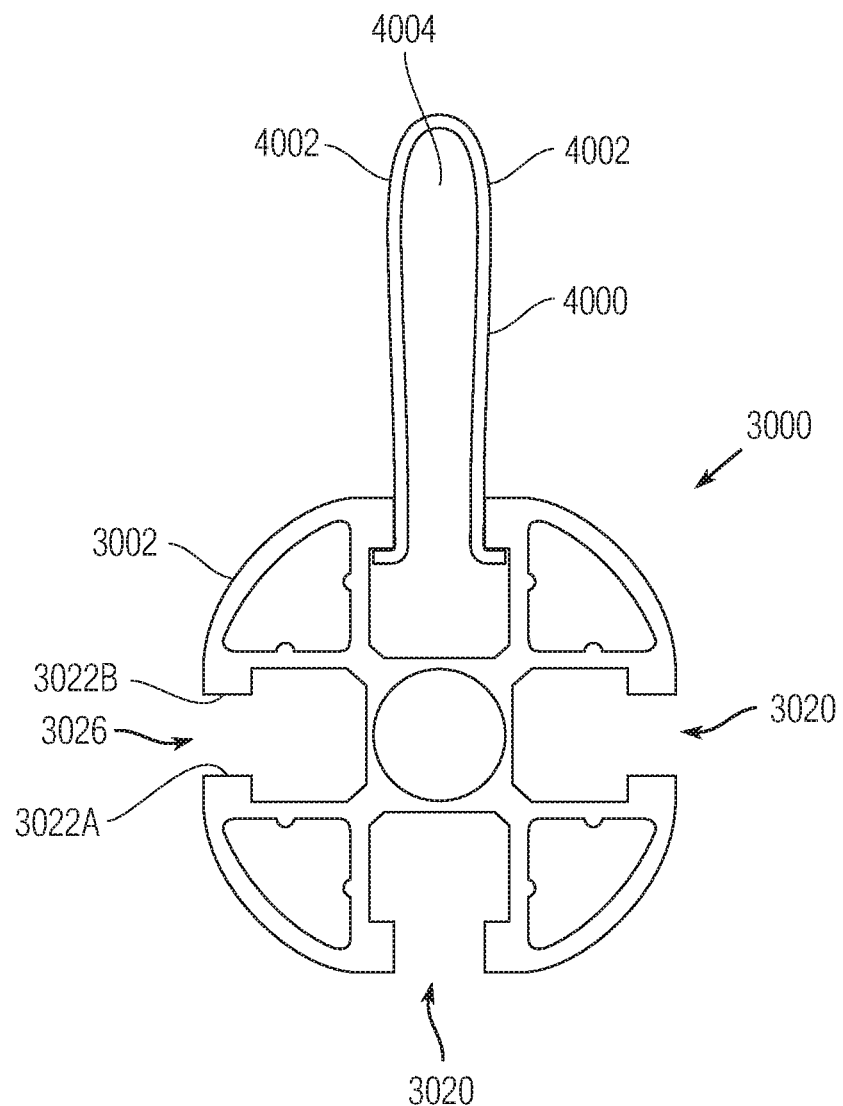
FIG. 3A shows a cross-section view of an elongated structural member with C-channel grooves, having a brush flap according to a second arrangement.

Referring to FIG. 3A, a closed-cell silicone foam rubber brush 3000 is shown according to one embodiment. The brush 3000 includes an extrusion 3002 having a cross-section that provides structure for the mechanical attachment of accessories. The extrusion 3002 includes C-channel grooves 3020 around its perimeter. The C-channels further comprise a mouth 3026 and two opposing lips 3022A and 3022B attached to either side of the mouth. A sheet of closed-cell silicone foam rubber material 4000 is attached to the extrusion 3002 at each C-channel. The sheet is folded to create a double-side flap 4002. The middle area 4004 of the flap 4002 can include a filler material (e.g., a second expanded foam) that provides mechanical support to the silicone foam rubber flap. The filler material, which provides a flexible, structural support, can be selected in order to achieve a desired mass, stiffness, inertia, and contact profile of the brush flaps based on the characteristics of the filler material.

Figure 3B:
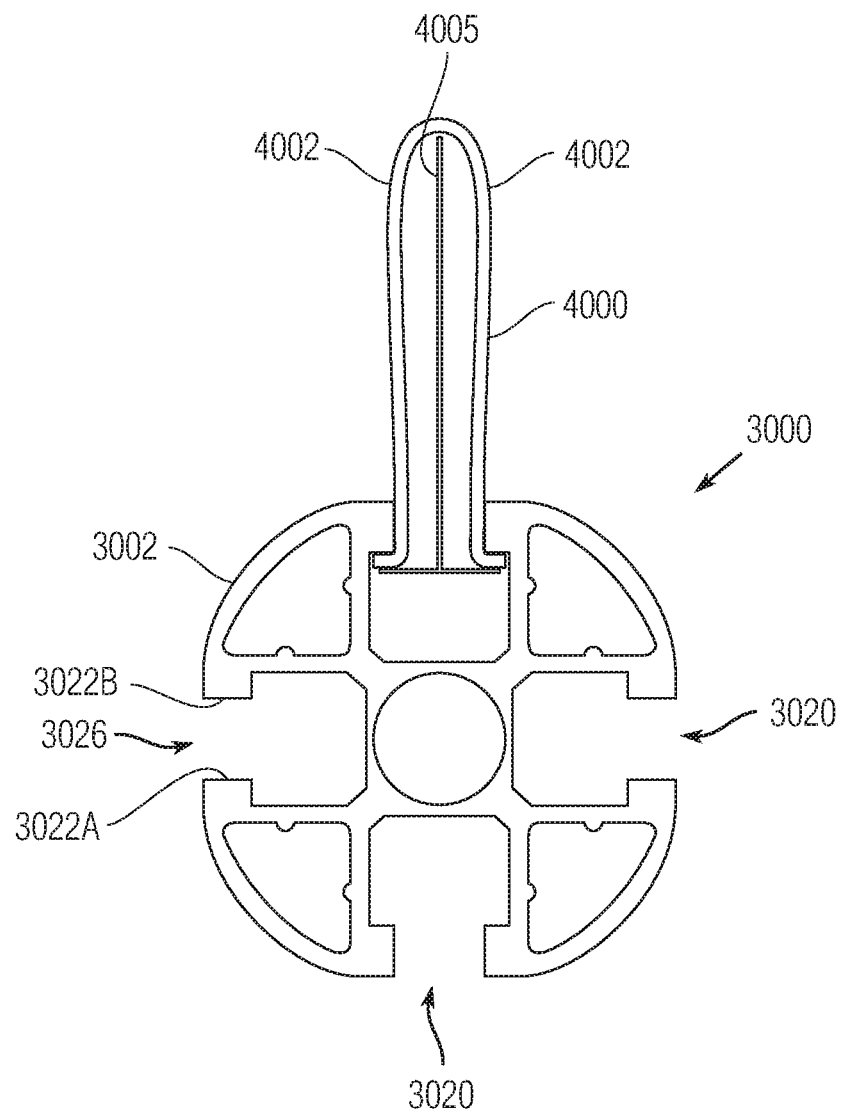
FIG. 3B shows a cross-section view of an elongated structural member with C-channel grooves, having a brush flap and flexible member according to a another arrangement.

As another example, referring to FIG. 3B, in addition to the filler material or as an alternative to the filler material a piece of spring steel 4005 can be included to provide additional rigidity. The spring steel can increase the pressure applied to the surface during brushing such that the pressure is sufficient to perform the cleaning, buffing, and/or polishing operation on the surface. In the arrangement shown in FIG. 3B, the spring steel 4005 is disposed on the inner side of the folded sheet while the outer side is available to slidingly contact the surface. In this structural arrangement, the spring steel is adjacent a trailing side of the flap material irrespective of the direction of movement of the flap since the leading side (i.e., the side that contacts the surface) is on an outer side of the folded flap. In other arrangements (e.g., a non-folded flap arrangement of FIG. 4A-4B), the flexible structural element (e.g., spring steel, filler backing, other sufficiently stiff member, etc.) can be located adjacent the trailing side (i.e., non-contracting side) of the flap. The flexible structural element can extend along the entire width of the flap and also have a similar height as the flap. In other arrangements, the flexible structural element can have a width less than the flap width and/or can have a height less than the flap height.

As shown in FIGS. 3A and B, the extrusions include four C-channels. As another example, the extrusion can include more or less C-channels in order to provide a core member that has more or less attachment points for the sheets of material. Accordingly, the core member can include a varying number of flaps disposed around its periphery, and more specifically, an outer periphery, and extending therefrom. The flaps can be arranged in pairs such that they are disposed on opposite sides of the core member. In other arrangements, the flaps can be spaced about the outer periphery of the core member at equal spacings in order to provide a balanced distribution about the core member.

Other structures that can be used to secure the silicone foam rubber material (e.g., silicone foam rubber material sheet 4000) that forms the cleaning surface of a brush are disclosed in co-pending U.S. patent application Ser. No. 15/425,441, filed Feb. 6, 2017 and titled "Tool-Less Spring Attachment to C-Channel and Method of Using Same," which is hereby incorporated by reference as if set forth in its entirety herein. In one embodiment, the coil-shaped element 100 is connected to the silicone foam rubber material 104 that is to be attached or detached to the c-channel. The coil-shaped element can be made from a variety of materials that are sufficiently durable and resiliently compressible in response to an applied force. In certain embodiments, the coil-shaped element is a steel spring or a plastic spring. In other embodiments, the coil-shaped element has a coating or is made from a softer/flexible material to avoid having a sharp edge at each coil element along the pitch of the coil.

Figure 3C:
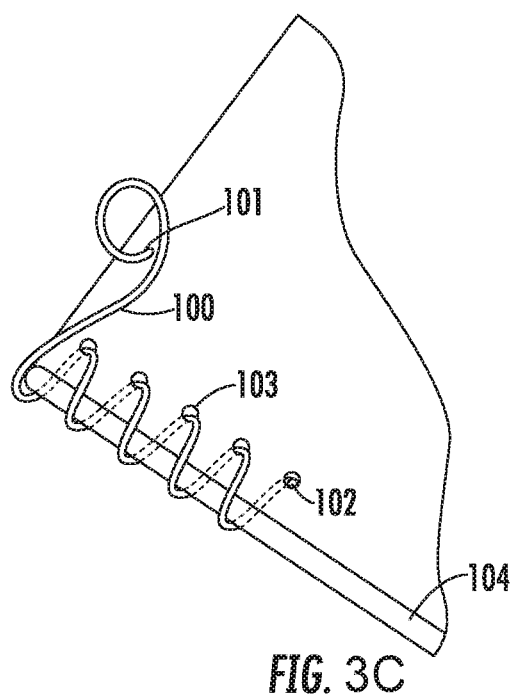
FIG. 3C is a perspective view of the coil-shaped element threaded through a material in accordance with at least one embodiment of the present invention.

In a particular embodiment, as shown in FIG. 3C, at least one relatively thin sheet of silicone foam rubber material 104 is connected to the coil-shaped element 100. In certain constructions, the silicone foam rubber material can be used without any connection adapters or adhesives because the coil-shaped element 100 can be directly threaded through the silicone foam rubber material 104. One type of connector or adapter may be an additional layer or extension of material that is sewn or otherwise attached to the silicone foam rubber material 104 that is to be connected. The coil-shaped element is then connected to the additional layer or extension. In one embodiment, the coil-shaped element is connected only to the additional layer or extension. Such a configuration may be useful for certain applications in which it is not desirable to pierce the silicone foam rubber material with the coil-shaped element. In another embodiment, the coil-shaped element is connected to both the additional layer or extension and the silicone foam rubber material 104 itself. In one embodiment, holes 103 are punctured in the silicone foam rubber material 104 so that the coil-shaped element 100 can be threaded through the silicone foam rubber material 104. In another embodiment, the coil-shaped element 100 has a piercing tip with a compressive strength selected to be sufficient to puncture a thin material without permanently deforming its coiled shape, including the segment of the coil-shaped element that is just proximal to the piercing tip. The coil-shaped element 100 can be threaded through the material by feeding end 102 through the holes 103 in the silicone foam rubber material 104. In another embodiment, an adhesive is used to attach the silicone foam rubber material 104 to the coil-shaped element 100 so that the stress is distributed over a larger area, rather than just at the contact points of the coil-shaped element 100 and the silicone foam rubber material 104. As discussed in more detail below, a sealant can further be used to distribute stress over a larger area and reinforce the connection of the coil-shaped element 100 and silicone foam rubber material 104. Other methods of connecting the coil-shaped element to the silicone foam rubber material can be used.

In other embodiments, the coil-shaped element is used to mount sensors or to route cables along or within the grooves of equipment built using aluminum extrusions, such as c-channels.

Figure 4A:
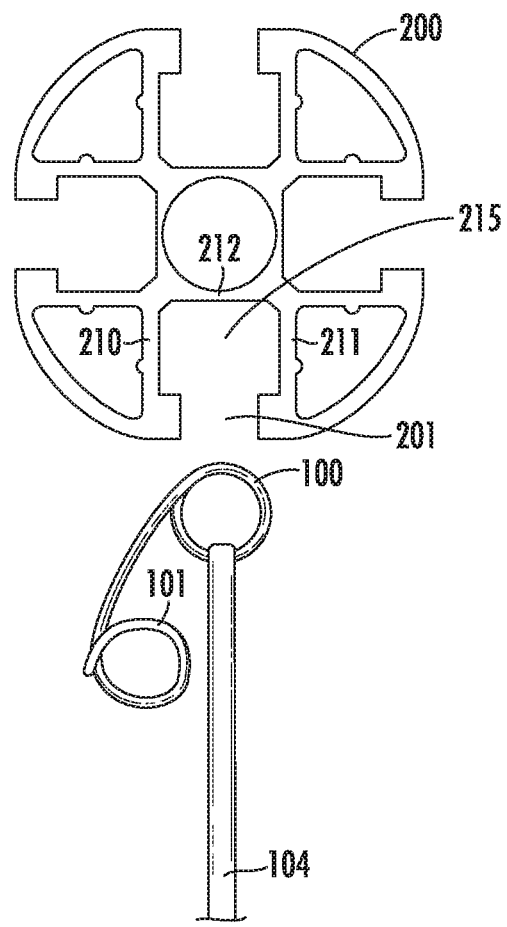
FIG. 4A is a side view of the coil-shaped element according to one arrangement prior to insertion into the groove of a c-channel.
Figure 4B:
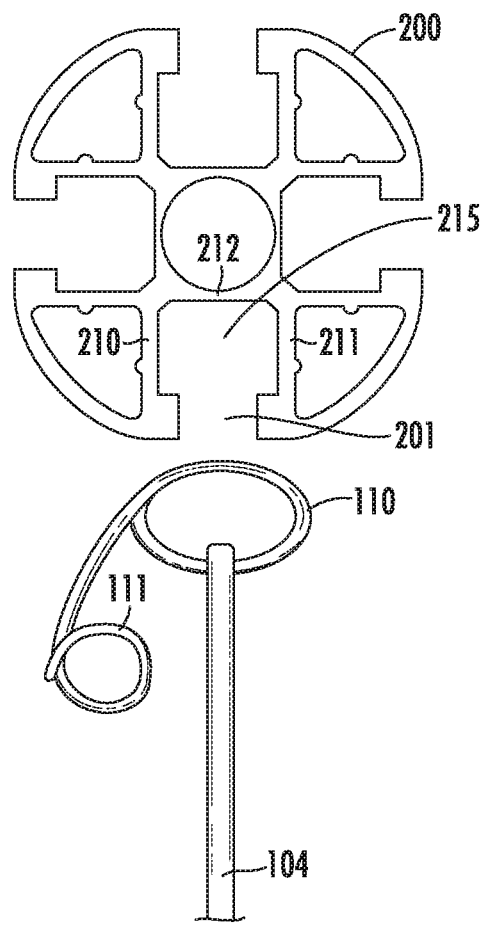
FIG. 4B is a side view of the coil-shaped element according to a further arrangement prior to insertion into the groove of a c-channel.

In another aspect of the invention, the coil-shaped element 100, 110 has a native, unbiased shape, as shown in FIGS. 4A and 4B. The interior of the c-channel groove 215 is formed by walls 210, 211, and 212. It further has an interior dimension from wall 210 to 211, and an aperture with a dimension that is less than the interior dimension from wall 210 to 211. In some embodiments, as shown in FIG. 4A, the coil-shaped element 100 has a dimension that is the same size as or wider than the aperture 201 of the c-channel 200, but less than the width of the interior of the c-channel groove (from wall 210 to 211). This enables the coil-shaped element 100 to be navigated through the aperture 201 and rest within the c-channel groove 215 without falling out of the aperture. Such a configuration may be used when the coil-shaped element 100 is the same as or close to the length of the c-channel 200, such that the coil-shaped element 100 will not slide out of place. If the coil-shaped element only covers parts of the c-channel groove, it is important to secure the coil-shaped element so that it does not slide along the groove. Some uses of the coil-shaped element 100 and silicone foam rubber material 104 may create a secure connection between the coil-shaped element 100 and the groove 215. A spinning rotation of the c-channel, for example, may create a centrifugal force that holds the coil-shaped element 100 and silicone foam rubber material 104 in place. In other embodiments, as shown in FIG. 4B, the coil-shaped element 110 has a dimension that is wider than both the aperture 201 and the interior of the c-channel groove (from wall 210 to 211). This enables the coil-shaped element to be frictionally seated against the inner walls 210, 211, 212 of the groove 215, which inhibits or impedes release of the coil-shaped element from the channel and sliding therein. Inserting the coil-shaped element orthogonally can also impede or prevent sliding.

A salient aspect of the invention is that the invention enables attachment-to and detachment-from the c-channel groove without requiring tools and without needing to access the end of the c-channel. Therefore, the silicone foam rubber material 104, or the sensors or cables and so on, need not be slid into the groove from the end of the c-channel. Having the ability to attach or detach the material from anywhere along the length of the groove is particularly advantageous in systems where only a portion of the c-channel may be accessible. Inserting the material along the length of the groove instead of at the end also eliminates the need for tools to be used to disassemble and reassemble the system. The coil-shaped element can span the entire length of the c-channel groove or a portion of it such that the silicone foam rubber material 104 is only supported at certain places.

Figure 5A:
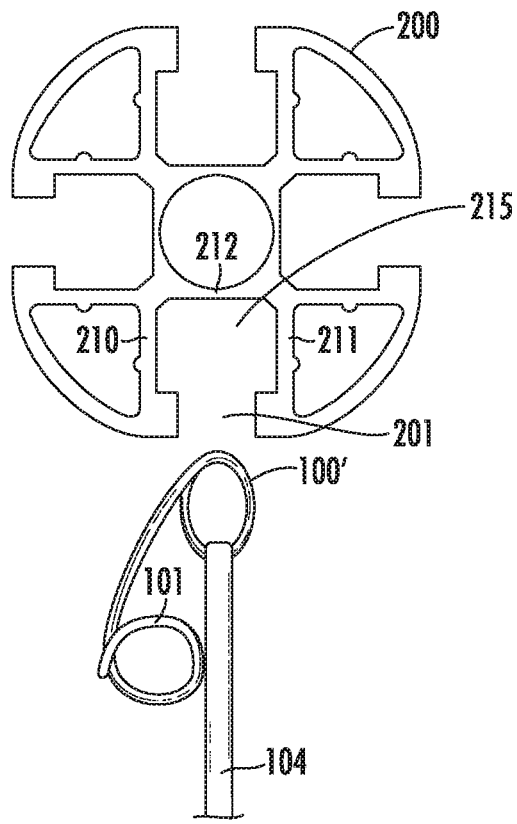
FIG. 5A is a side view of the biased coil-shaped element of FIG. 4A prior to insertion into the groove of a c-channel.
Figure 5B:
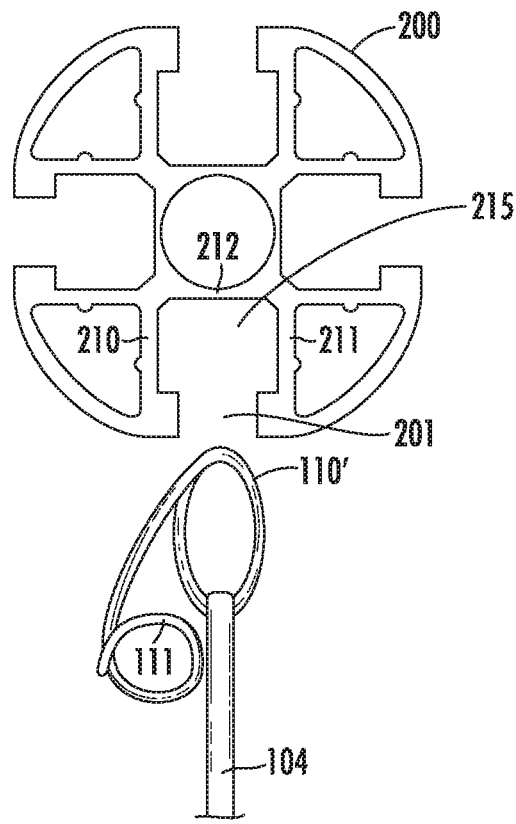
FIG. 5B is a side view of the biased coil-shaped element of FIG. 4B prior to insertion into the groove of a c-channel.
Figure 6A:
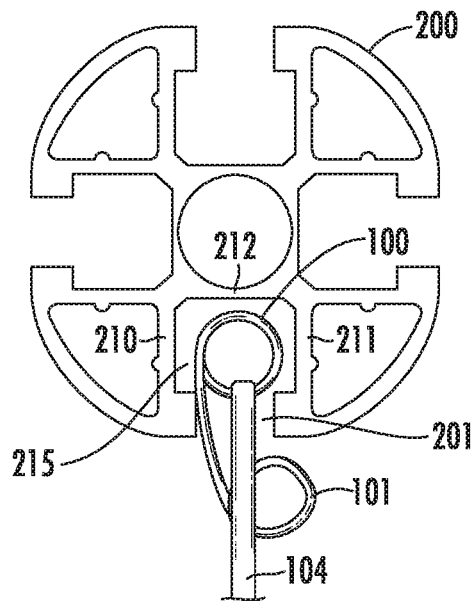
FIG. 6A is a side view of the coil-shaped element of FIG. 4A after insertion into the groove of a c-channel.
Figure 6B:
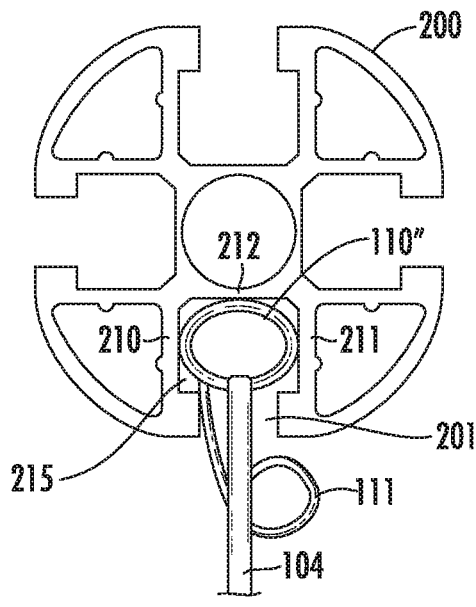
FIG. 6B is a side view of the coil-shaped element of FIG. 4B after insertion into the groove of a c-channel.

In use, a coil-shaped element is connected to the desired silicone foam rubber material 104, which can be achieved by threading or adhesive, among other means. As discussed above, the dimension of the coil-shaped element in its unbiased state is greater than the dimension of the aperture 201 of the c-channel groove. In some embodiments, a coating is applied to the coil-shaped element prior to connection to avoid it having a sharp or rough edge. In other embodiments, as discussed in more detail below, reinforcement can be added to the silicone foam rubber material 104 before or after it is connected to the coil-shaped element to prevent ripping. The coil-shaped element is then attached or mounted to the c-channel groove by twisting (and thereby advancing into the channel) or squeezing the coil-shaped element into a biased state. The application of another force can be used to get the coil-shaped element into a biased state, such as a manually applied force. The biased state results from resilient compression of the coil-shaped element along its length, not by compressing it end to end, as shown in FIGS. 5A and 5B. Enough force must be applied to bias the coil-shaped element to a dimension that is less than or equal to the dimension of the aperture 201. FIG. 5A shows biased coil-shaped element 100', which is biased to the point where it can be navigated through the aperture 201 of the groove 215. The biased coil-shaped element 100' is then positioned such that at least a portion of it is in the c-channel groove 215, as shown in FIG. 4A. The biased coil-shaped element 100' can then be restored to its original dimension, which is less than the dimension of the interior of the c-channel groove 215 but greater than the dimension of the aperture 201.

In another embodiment, as shown in FIG. 5B, the biased coil-shaped element 110' must be biased to the point where it can be navigated through the aperture 201 of the groove 215. That is, it must be biased to a dimension that is less than or equal to the dimension of the aperture 201. The biased coil-shaped element 110' is then positioned such that at least a portion of it is in the c-channel groove 215, as shown in FIG. 4B. The biased coil-shaped element 110' can then be restored so that it approaches its original dimension, which is larger than both the aperture and the interior of the c-channel groove. The biased coil-shaped element 110' will expand until it is frictionally seated against at least one of the interior walls 210, 211, 212 of the c-channel groove. Depending on the size of the c-channel groove 215 and the coil-shaped element 110, the coil-shaped element 110 may expand to its original dimension or some dimension less.

In other embodiments, at least the coil-shaped element and top portion of the silicone foam rubber material 104 that is connected to the coil-shaped element are sealed together. For instance, the sealant can extend along an edge or flap of the silicone foam rubber material 104. In another embodiment, if an additional layer is attached to the silicone foam rubber material 104, the sealant can extend along an edge or flap of that layer. Types of sealants may include silicone, acrylic resins, adhesive, epoxy, wax, polyurethane, or rubber. Methods of sealing may include dipping, painting or spraying, and each method can result in sealing at least a portion of the coil-shaped element and material together, whether continuously along an edge or flap of the silicone foam rubber material 104, or otherwise. The sealant serves as an extra reinforcing layer and aids in distributing any stresses along a length of the silicone foam rubber material 104 or additional layer, as the case may be, rather than just at the points of contact between the coil-shaped element and the material. This can further prevent or reduce ripping of the material at the points of contact with the coil-shaped element.

Figure 7A:
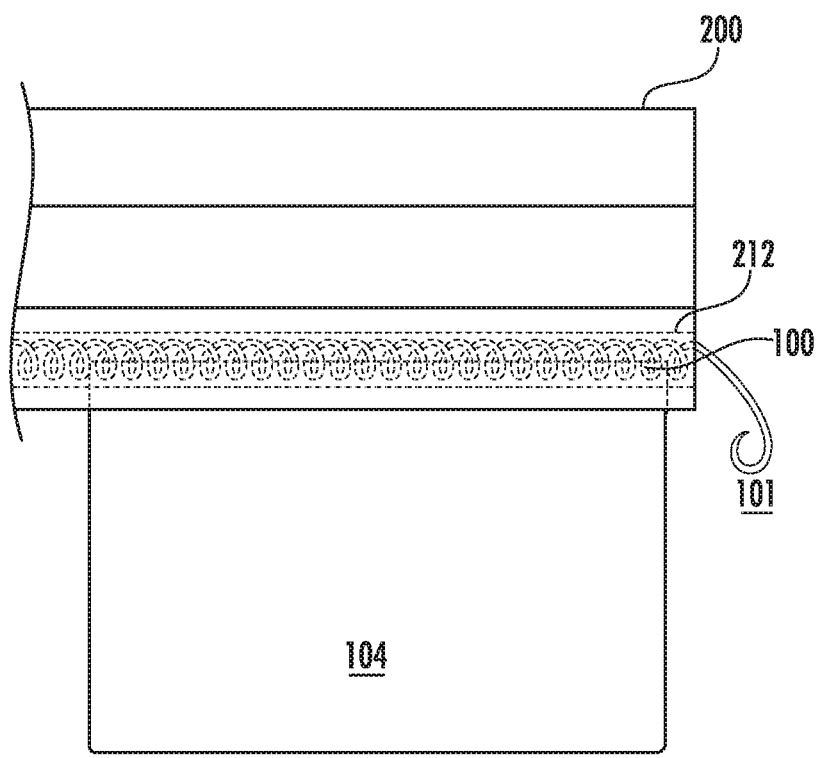
FIG. 7A is a front view of the coil-shaped element of FIG. 4A after insertion into the groove of a c-channel.
Figure 7B:
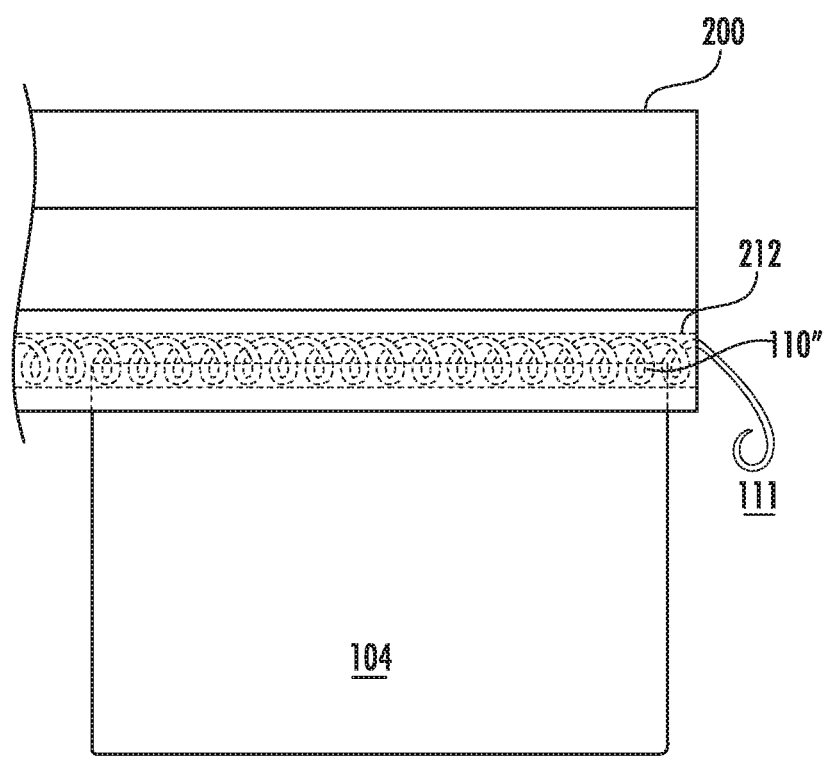
FIG. 7B is a front view of the coil-shaped element of FIG. 4B after insertion into the groove of a c-channel.

In some embodiments, when the silicone foam rubber material 104 is attached to the c-channel groove 200 using the coil-shaped element as shown in FIG. 7A or 7B, a cleaning brush is defined. The coil-shaped element can be attached to the c-channel groove either in-line or orthogonally.

The coil-shaped element can be removed in a similar fashion to its insertion, where the coil-shaped element is biased so that it can be navigated out of the aperture 201 of the c-channel groove.

Figure 8:
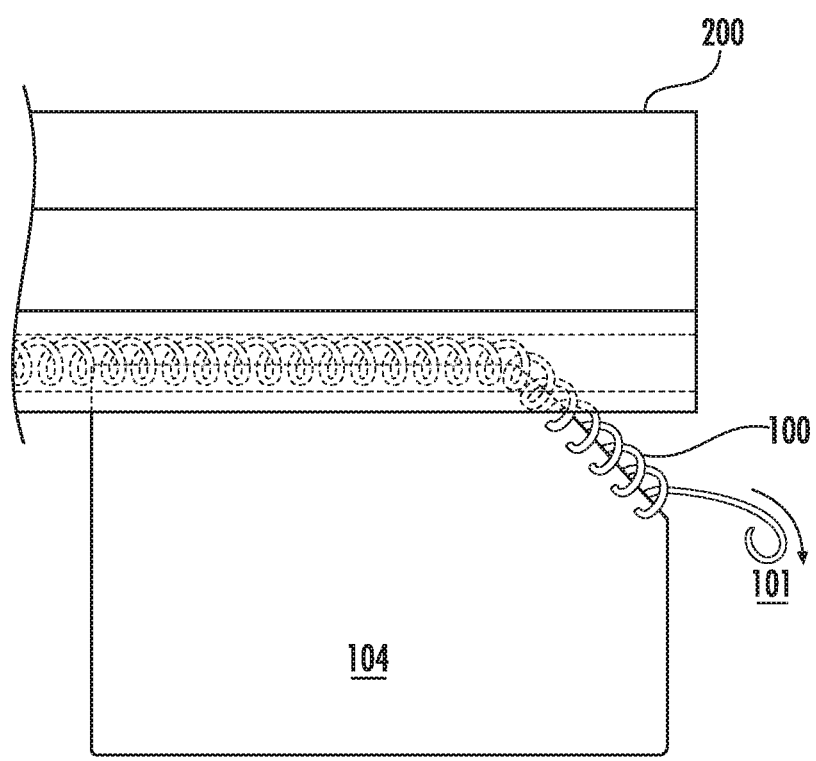
FIG. 8 is a front view of the coil-shaped element being removed from the groove of a c-channel in accordance with at least one embodiment of the present invention.

FIGS. 6A, 6B, 7A and 7B show another aspect of the invention, wherein an end portion of the coil-shaped element 101, 111 is extended outside of the aperture 201. The end portion 101, 111 protrudes out of the c-channel groove so that it is easily accessible and functions similar to a tab pull or as a pulling point. In use, this can be achieved by positioning end portion 101, 111 at an angle prior to insertion or bending end portion 101, 111 after insertion so that it extends out of the c-channel groove. FIG. 8 demonstrates that the end portion 101 can be pulled out of the c-channel groove, thereby removing the coil-shaped element 100 and the silicone foam rubber material 104 attached to it.

In other embodiments, the silicone foam rubber material 104 can be reinforced against ripping at the points where the coil-shaped element runs through the silicone foam rubber material 104 or other weak points. When polymer materials are used, such as closed-cell silicone foam sheets, the inner walls of the holes 103 can be melted to prevent ripping. An alternative reinforcement can comprise a glue seam (not shown) along the union of the silicone foam rubber material 104 and the coiled-shaped element 100.

Melting of the material after connection to the coil-shaped element can have other advantages. When the material is threaded with the coil-shaped element, micro-tears can occur. Melting of the material can aid in mending those tears and preventing further tearing or ripping of the material by the coil-shaped element.

Another aspect of the invention is to use means to secure the material to the coil-shaped element to prevent sliding or rotation around the coil-shaped element. One way to accomplish this is by melting the material onto the coil-shaped element. Another way to accomplish this is by gluing the material to the coil-shaped element at points of contact between the material and the coil-shaped element. Depending on the materials used, glue can be applied at some of the points of contact to achieve a secured connection. For example, a spot of glue can be applied at one or both ends of the coil-shaped element where it meets the material, or only where the spring enters the material. These and all securing methods described herein can be applied before, during or after the connection of the coil-shaped element to the material, whether by threading or otherwise.

In another aspect of the invention, the coil-shaped element is used to facilitate the replacement of worn out flaps on a brush with new ones. In such circumstances, the coil-shaped element and/or material can be disposable so that it does not matter if they are damaged during removal. When the element is removed, the material can also be removed.

In addition, the closed-cell silicone foam rubber flap material can be incorporated with or be used in combination with a cloth material (e.g., nonwoven polyester blend cloth) to provide a hybrid brush flap.

Figure 9:
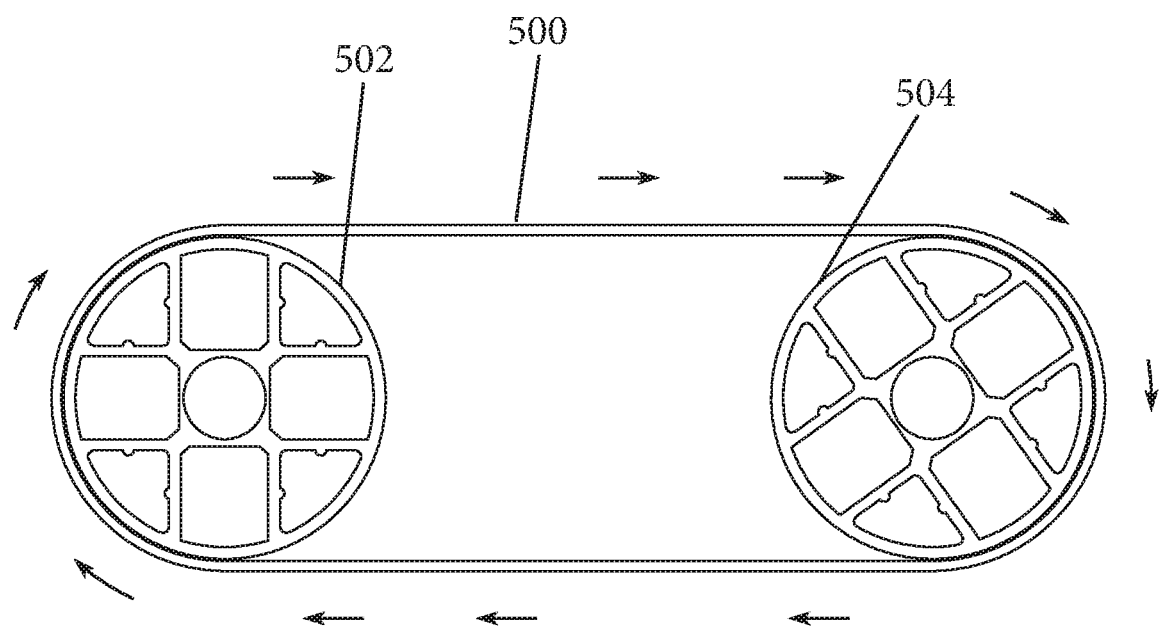
FIG. 9 shows a cross-section and perspective view of a surface treatment tool having two supports and a belt extending therebetween.
Figure 9:
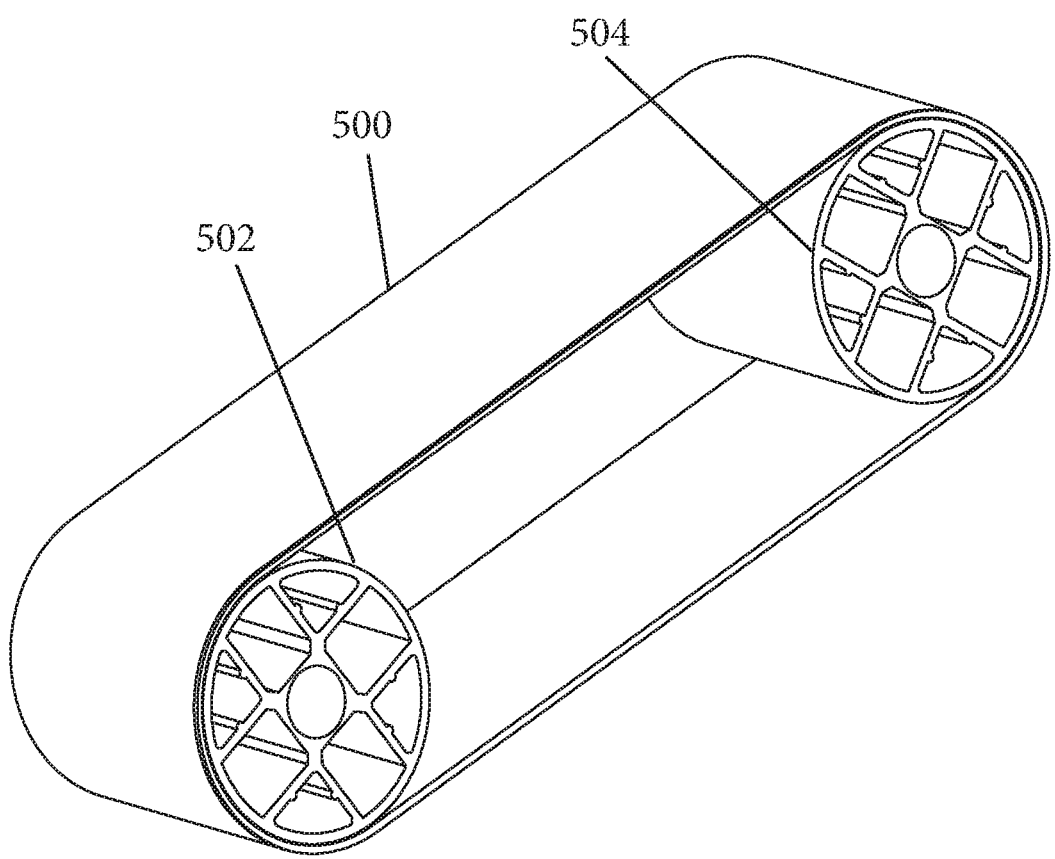

Referring to FIG. 9, the silicone foam material can be provided in the form of a belt 500. The belt 500 can be disposed about and supported by two support elements 502 and 504, which can be cylindrically shaped extrusions. The supports can have a rigidity in excess of the rigidity of the belt. One or both of the support elements can be rotated in order to move the belt to slide relative to the surface (e.g., solar panel) to perform one of a cleaning, buffing, or polishing operation on the surface. The distance between the support elements can be adjusted in order to adjust the tension in the belt.

Figure 10:
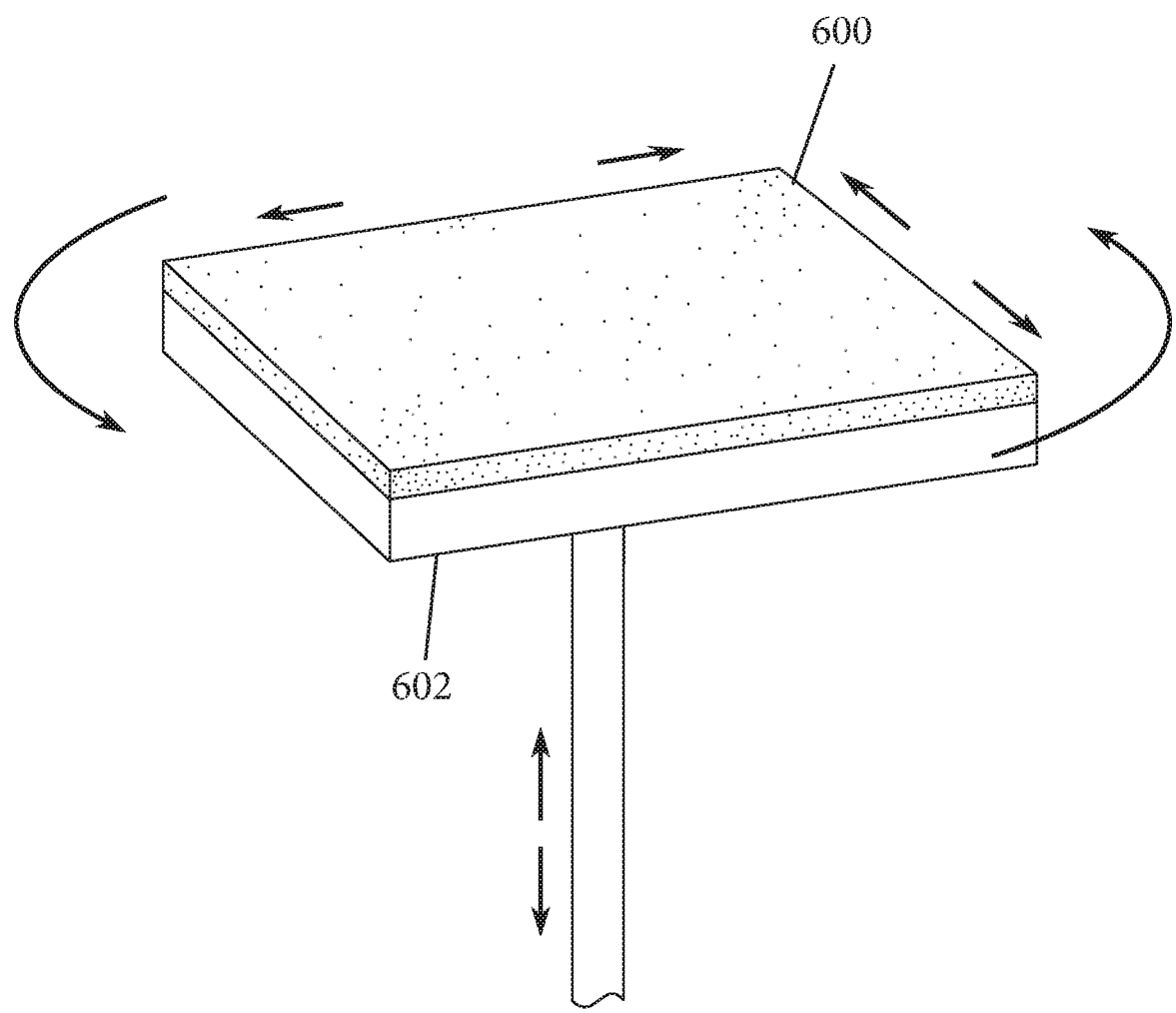
FIG. 10 shows an elevation view of a surface treatment tool having a backer and a pad.

Referring to FIG. 10, the silicone foam material can be provided in the form of a pad 600. The pad 600 can be supported by a backer plate 602. For example, the pad can be attached using adhesive, hook and loop fasteners, clips, etc. The backer plate can have a rigidity in excess of the rigidity of the pad. The backer plate 602 can be moved in a side-to-side, front-to-back, twisting, orbital, or vibrational motion or a combination thereof. The movement of the backer plate 602 can cause the pad to slide relative to a surface (e.g., solar panel) to perform one of a cleaning, buffing, or polishing operation on the surface. In addition, the backer plate can be moved up and down relative to the surface to adjust the pressure between the surface and the pad.

The brushes and tools described herein can be moved in various ways to perform a cleaning, brushing, or polishing operation. For example, the brush can undergo a localized movement, which can include rotating, translating (e.g., side-to-side and/or front-to-back), twisting, orbital, or vibrational movements. The localized movement of the brush can operate on a local area of the surface. In addition, the brush can also undergo a macro movement relative to the surface so that larger areas of the surface can be brushed. For example, the brush can be mounted to a cleaning robot and the core member can be rotated to rotate the flaps and the robot can move along the surface. In other arrangements, the brush can be stationary and the surface can be moved relative to the brush. Accordingly, various combinations of movements of the brushes and tools are contemplated in order to cause the silicone foam material to slide across the surface in order to perform a cleaning, brushing, or polishing operation.

The inventors have discovered, surprisingly, that the silicone foam brushes described herein provide a significant benefit when used on solar panel surfaces, which typically include a glass. As another example, the silicone foam brushes can be used on glass, which is a hard, smooth, homogenous surface, which is believed to benefit from the invention for similar reasons as the solar panels, possibly further because of the closed-cell silicone foam rubber brush acting on a surface that comprises of a silicon-based substrate. In other applications, cleaning, buffing and polishing can be to hard smooth surfaces such as industrial nails or teeth and other metal when acted upon by the brush. Car body surfaces and parts fall into this category. Stone, hard plastics and possibly rubber can be acted upon by the brush of the present invention.

While the invention has been particularly shown and described with reference to a preferred embodiment thereof, it will be understood by those skilled in the art that various changes in form and details may be made therein without departing from the spirit and scope of the invention. It should be understood that various combination, alternatives and modifications of the present invention could be devised by those skilled in the art. The present invention is intended to embrace all such alternatives, modifications and variances that fall within the scope of the appended claims.

What is claimed is:

1. A brush suitable for performing at least one of a cleaning, buffing, and polishing action on a surface without requiring water, comprising:
   a core member, the core member having a central axis surrounded by a plurality of C-channel grooves, each of the C-channel grooves having an opening with lips positioned adjacent to the opening, the lips having an external facing surface and an internal facing surface; and
   a plurality of sheets of material, each sheet of material comprised of closed-cell silicone foam rubber, being folded to define a double-sided flap, and secured to the internal facing surface of the lips of a respective one of the plurality of C-channel grooves;
   wherein each sheet of material is secured to the core member to permit relative movement of the double-sided flap with respect to the surface in at least a first direction, and
   wherein the relative movement of the double-sided flap produces at least one of the cleaning, buffing and/or polishing action on the surface without requiring water.

2. The brush according to claim 1, wherein the plurality of double-sided flaps secured to respective C-channel grooves define a symmetric pattern of flaps around the core member.

3. The brush according to claim 1, wherein the double-sided flaps include a middle area between the folded sheet material, the brush further comprising a flexible structural element disposed within the middle area.

4. The brush according to claim 3, wherein the flexible structural element is configured to increase a pressure between the double-sided flap and the surface being cleaned during contact by the sheet of material.

5. The brush according to claim 1, wherein the core member includes a flat surface adjacent each double-sided flap.

6. The brush according to claim 1, wherein the surface is a solar panel and wherein the relative movement of the double-sided flap produces at least one of the cleaning, buffing and/or polishing action on the solar panel to improve a light transmission characteristic of the solar panel.

\* \* \* \* \*